United States Patent
Eriksson et al.

(10) Patent No.: US 11,662,243 B2
(45) Date of Patent: May 30, 2023

(54) GUIDED WAVE RADAR LEVEL GAUGE HAVING AN EXPLOSION PROOF HOUSING WITH AN INTRINSICALLY SAFE OUTPUT

(71) Applicant: ROSEMOUNT TANK RADAR AB, Mölnlycke (SE)

(72) Inventors: Mikael Eriksson, Västervik (SE); Leif Nilsson, Linköping (SE); Håkan Nyberg, Linköping (SE)

(73) Assignee: ROSEMOUNT TANK RADAR AB, Mölnlycke (SE)

( * ) Notice: Subject to any disclaimer, the term of this patent is extended or adjusted under 35 U.S.C. 154(b) by 313 days.

(21) Appl. No.: 16/895,305

(22) Filed: Jun. 8, 2020

(65) Prior Publication Data

US 2020/0393285 A1 Dec. 17, 2020

(30) Foreign Application Priority Data

Jun. 11, 2019 (EP) .................................. 19179520

(51) Int. Cl.
*G01F 23/284* (2006.01)
*H05K 5/02* (2006.01)
(Continued)

(52) U.S. Cl.
CPC ............ *G01F 23/284* (2013.01); *G01S 7/282* (2013.01); *G01S 7/285* (2013.01); *H05K 5/0217* (2013.01)

(58) Field of Classification Search
CPC .......... G01F 23/284; G01S 7/285; G01S 7/03; G01S 13/88; G01S 7/282; H02H 9/008; G01N 2035/1025
See application file for complete search history.

(56) References Cited

U.S. PATENT DOCUMENTS

| 5,345,471 A | 9/1994 | McEwan |
| 5,523,760 A | 6/1996 | McEwan |

(Continued)

FOREIGN PATENT DOCUMENTS

| KR | 2013-0045070 A | * 10/2011 | ........... G01F 23/284 |
| WO | WO 2019/099301 | 5/2019 | |
| WO | WO 2020/126003 | 6/2020 | |

OTHER PUBLICATIONS

Extended European Search Report from European Application No. 19179520.2, dated Nov. 27, 2019.
(Continued)

*Primary Examiner* — Vladimir Magloire
*Assistant Examiner* — Oladimeji Oyegunle
(74) *Attorney, Agent, or Firm* — Westman, Champlin & Koehler, P.A.

(57) ABSTRACT

A guided wave radar level gauge comprising an explosion proof housing with an intrinsically safe (IS) output, a resistor having a first terminal connected to the IS output and a second terminal connected to the housing ground potential, and a transmission line probe connected to the IS output. The housing encloses radar level gauge (RLG) circuitry and a microwave unit having a floating ground potential, and a set of blocking capacitors connected between the microwave unit and the IS output. The microwave unit includes a differential receiver, having a first terminal connected to the IS output via the set of blocking capacitors, and a second terminal connected to the housing ground potential via the set of blocking capacitors, a voltage between the first and second terminals forming an input signal to the differential receiver.

15 Claims, 4 Drawing Sheets

(51) Int. Cl.
    *G01S 7/282*     (2006.01)
    *G01S 7/285*     (2006.01)

(56) References Cited

U.S. PATENT DOCUMENTS

| | | |
|---|---|---|
| 5,609,059 A | 3/1997 | McEwan |
| 5,656,774 A | 8/1997 | Nelson et al. |
| 5,774,091 A | 6/1998 | McEwan |
| 6,801,157 B2 | 10/2004 | Haynes |
| 2001/0050629 A1 | 12/2001 | Benway et al. |
| 2004/0066324 A1 | 4/2004 | Haynes |
| 2004/0085240 A1 | 5/2004 | Faust |
| 2005/0024259 A1 | 2/2005 | Berry et al. |
| 2006/0001567 A1 | 1/2006 | Nilsson |
| 2008/0074309 A1 | 3/2008 | Nilsson |
| 2009/0033543 A1 | 2/2009 | Nilsson et al. |
| 2009/0303106 A1 | 12/2009 | Edvardsson |
| 2014/0005959 A1 | 1/2014 | Nilsson et al. |
| 2016/0146924 A1* | 5/2016 | Williams ................ G01S 13/88 342/124 |
| 2016/0262254 A1 | 9/2016 | Meijer |
| 2016/0266240 A1 | 9/2016 | Hughes et al. |
| 2018/0094964 A1 | 4/2018 | Eriksson |

OTHER PUBLICATIONS

AN9003—A Users Guide to Intrinsic Safety, Cooper Crouse-Hinds, Retrieved Sep. 25, 2012, 20 pgs.
European Search Report from European Patent Application No. EP 19198458.2, dated Mar. 23, 2020.
Office Action from U.S. Appl. No. 17/022,275, dated Aug. 30, 2022.

\* cited by examiner

GUIDED WAVE RADAR LEVEL GAUGE HAVING AN EXPLOSION PROOF HOUSING WITH AN INTRINSICALLY SAFE OUTPUT

CROSS-REFERENCE TO RELATED APPLICATION

This application claims priority to European Patent Application No. EP19179520.2, filed on Jun. 11, 2019, the content of which is hereby incorporated by reference in its entirety.

FIELD OF THE INVENTION

The present invention relates to a radar level gauge having an explosion proof (e.g. Ex-d) compartment with an intrinsically safe (e.g. Ex-ia) connection. Such an explosion proof compartment with an IS connection is particularly desired in a guided wave radar (GWR) level gauge.

BACKGROUND OF THE INVENTION

Radar level gauge (RLG) systems are in wide use for determining the filling level of a product contained in a tank. Radar level gauging is generally performed either by means of non-contact measurement, whereby electromagnetic signals are radiated towards the product contained in the tank, or by means of contact measurement, often referred to as guided wave radar (GWR), whereby electromagnetic signals are guided towards and into the product by a probe acting as a waveguide. The probe is generally arranged to extend vertically from the top towards the bottom of the tank. The probe may also be arranged in a measurement tube, a so-called chamber, which is connected to the outer wall of the tank and is in fluid connection with the inside of the tank.

The transmitted electromagnetic signals are reflected at the surface of the product, and the reflected signals are received by a receiver or transceiver comprised in the radar level gauge system. Based on the transmitted and reflected signals, the distance to the surface of the product can be determined.

The distance to the surface of the product is generally determined based on the time between transmission of an electromagnetic signal and reception of the reflection thereof in the interface between the atmosphere in the tank and the product contained therein. In order to determine the actual filling level of the product, the distance from a reference position to the surface is determined based on the above-mentioned time and the propagation velocity of the electromagnetic signals.

Most radar level gauge systems on the market today are either so-called pulsed radar level gauge systems that determine the distance to the surface of the product contained in the tank based on the difference in time between transmission of a pulse and reception of its reflection at the surface of the product, or systems that determine the distance to the surface based on the phase difference between a transmitted frequency-modulated signal and its reflection at the surface. The former type of systems is generally referred to as time domain reflectometry (TDR) systems, and an example is provided in U.S. Pat. No. 6,801,157. The latter type of systems is generally referred to as FMCW (Frequency Modulated Continuous Wave) systems.

In some applications, an RLG is used in a hazardous environment, e.g. in connection to a tank with flammable and explosive gases and liquids. In such applications, the RLG must be designed to avoid igniting explosions.

For a non-contact RLG, i.e. an RLG emitting electromagnetic signals by means of a directional antenna, the RLG may be separated from the tank interior by a microwave window. For such RLGs, it may therefore be sufficient to place the RLG in an explosion proof housing (referred to as an Ex-d housing). For guided wave radar (GWR), however, where the probe extends into the tank interior, explosion proof is not sufficient, and GWR level gauges are therefore typically designed to be intrinsically safe. When circuitry is "intrinsically safe" the available electrical and thermal energy in the circuitry is restricted such that ignition of a hazardous atmosphere (explosive gas or dust) cannot occur, even under worst case conditions. For details of the IS concept, reference is made to "AN9003—A Users Guide to Intrinsic Safety", Cooper Crouse Hinds, Retrieved 25 Sep. 2012. Examples of norms for intrinsic safety are IEC 610079-0 and IEC 610079-11.

In some applications, an explosion proof housing needs to be provided with an intrinsically safe output (IS output). One straightforward approach to such a design is to have the circuitry in the housing grounded to the housing ground. However, there are advantages to having the circuitry in the housing connected to a "floating" ground, i.e. ground potential which is independent of the housing ground. This requires blocking any DC components caused by differences in ground potential. One issue with such a solution is reception of signals while still maintaining a satisfactory signal-to-noise ratio, and complying with electromagnetic compatibility (EMC) requirements.

GENERAL DISCLOSURE OF THE INVENTION

It is an object of the present invention to provide an improved reception of signals through an IS output of an explosion proof housing.

According to a first aspect of the invention, this and other objects is achieved by a guided wave radar level gauge for determining the filling level of product in a tank, the gauge comprising a housing providing explosion proof protection, and being electrically connected to a housing ground potential, an explosion proof first signal passage in the housing wall, the first signal passage configured to be connected to an external power supply, an explosion proof second signal passage in the housing wall, the second signal passage providing an intrinsically safe (IS) output, a resistor having a first terminal connected to the IS output and a second terminal connected to the housing ground potential, a transmission line probe connected to the IS output, the probe being adapted to direct a microwave transmit signal toward the product and return reflections thereof from a surface of the product. The housing encloses radar level gauge (RLG) circuitry, a microwave unit connected to the IS output, the microwave unit configured to generate and transmit an microwave transmit signal $S_T$ and receive a microwave return signal $S_R$ reflected from the tank, the RLG circuitry and the microwave unit having a floating ground potential which is independent from the housing ground potential, and a set of blocking capacitors connected between the microwave unit and the IS output, which blocking capacitors serve to block any DC components. The microwave unit includes a pulse generator having a first terminal connected to the IS output via the set of blocking capacitors, and a second terminal connected to the housing ground potential via the set of blocking capacitors, and a differential receiver, having a first terminal connected to the IS output via the set of blocking capacitors, and a second terminal connected to the housing ground potential via the set of blocking capacitors, a voltage between the first and second terminals forming an input signal to the differential receiver.

By "floating" is here intended that the floating ground potential is independent of the housing ground potential. The word "independent" should of course be interpreted as relating to realistic conditions. One way to accomplish such independence is to galvanically separate the floating barrier form the housing wall. However, complete galvanic separation may not be necessary, and for example the leakage current through a blocking capacitor may typically be disregarded.

According to the present invention, the high frequency unit includes a differential receiver, which has terminals connected—via the blocking capacitors—to the IS output and the housing ground potential. The blocking capacitors, arranged to separate the floating ground and the chassis ground, thus include at least one pair of blocking capacitors along the "signal line" (the line to the IS output) and at least one pair of blocking capacitors along the "ground line" (the line to housing ground potential). Such a differential design provides an increased flexibility to address challenges related to MEC as well as signal-to-noise ratio.

In order to create a matching with the coaxial tank wall feedthrough, to thereby avoid internal reflections, a resistor (typically 50 ohm) is connected between the signal line and ground line. When the blocking capacitors are placed on the probe side of this resistor (which is conventionally is the case), they must be relatively large (in the order of 1 nF) to ensure satisfactory matching.

According to an embodiment of the present invention, the set of blocking capacitors includes a first pair of blocking capacitors connected in series between the first terminal of the pulse generator and the first terminal of the resistor, a second pair of blocking capacitors connected in series between the second terminal of the pulse generator and the second terminal of the resistor, a third pair of blocking capacitors connected in series between the first terminal of the differential receiver and the first terminal of the resistor, and a fourth pair of blocking capacitors connected in series between the second terminal of the differential receiver and the second terminal of the resistor.

With this design, the blocking capacitors are placed "inside" the matching resistor (i.e. on the receiver side), and after the signal line and ground line are split and connected to the pulse generator and receiver, respectively. By arranging the blocking capacitors on these four lines, each pair of blocking capacitors "faces" the larger impedance of the pulse generator and receiver, respectively, and significantly smaller capacitors may be used. As examples, pulse generator typically has an impedance of around 500 ohm, and the capacitance "facing" the pulse generator may be reduced to 100 pF (i.e. two capacitors of 200 pF in series). The receiver may have even higher impedance, to allow reduction of the capacitance to 20 pF (i.e. two capacitors of 40 pF in series).

The differential receiver may include a first impedance increasing circuit connected to increase an input impedance of the first terminal, and a second impedance increasing circuit connected to increase an input impedance of the second terminal.

Such impedance increasing circuits serve to increase the input impedance of the differential receiver even further, thus even further reducing the required capacitance along the signal and ground lines connected to the receiver.

However, an increased input impedance of the differential receiver also has additional, separate advantages. For example, a high input impedance ensures low mismatch of the receive signal, and an improved signal-to-noise ratio due to smaller attenuation of the signal.

In some applications, the RLG circuitry is incompatible with intrinsic safety requirements, and the gauge may then comprise an electrical barrier connected between the RLG circuitry and the microwave unit, the electrical barrier preventing energy or voltages incompatible with IS requirements from reaching the microwave unit.

Such an electrical barrier, arranged between non-IS circuitry and IS circuitry, is referred to as an IS-barrier, and serves to "clamp" the individual signals with respect to voltage and current. A conventional IS-barrier involves fuses to protect from significant power surges, Zener diodes (typically three in parallel) to limit the voltage, and resistors to limit the current.

It is noted that an IS output of an explosion proof housing, using a floating ground IS barrier, is disclosed in co-pending (and presently non-published) patent application PCT/EP2018/086257.

There are several reasons why the RLG circuitry may not comply with IS requirements. For example, the RLG circuitry may include at least one energy store having an energy storage capacity which is incompatible with IS requirements at a voltage applied to the energy store. Such energy storage is typically required in order to intermittently provide sufficient energy for a measurement sweep, when the RLG is connected to a limited power source, such as battery or a two-wire control loop.

It is noted that the IS-barrier is incapable of handling the high frequency signals (e.g. in the GHz area) transmitted and received by a transceiver in the microwave unit, and therefore must be placed upstream the microwave unit.

For pulsed radar level gauging, the transmit signal is a train of pulses, each pulse having a duration in the order of ns, and a pulse repetition frequency in the order of MHz. In this case, the barrier connects electrical power from the RLG circuitry to the microwave unit, and a time expanded tank signal from the microwave unit to the RLG circuitry.

Typically, the RLG circuitry includes a frequency generator, configured to generate a first repetition frequency Tx, defining the pulse repetition frequency of the transmit signal, and a second repetition frequency Rx, for performing time domain reflectometry sampling of the return signal $S_R$. In this case, the barrier connects Rx and Tx clock signals from the RLG circuitry to the microwave unit.

The number of signals passing through the barrier may be reduced by arranging the frequency generator (e.g. a dual oscillator timing circuit, a delay lock loop, DLL, or a phase locked loop, PLL) downstream the barrier. In that case, the clock signals are generated on the microwave unit side, and do not need to pass the barrier. A drawback with this approach is that the frequency generator requires more power, thus causing a larger voltage drop across the barrier. Such a voltage drop increases the minimum voltage required to operate the RLG, sometimes referred to as "lift-off voltage". This voltage is an important design parameter in many applications where power is a limited resource (e.g. RLG powered by a two-wire control loop or internal battery).

BRIEF DESCRIPTION OF THE DRAWINGS

The present invention will be described in more detail with reference to the appended drawings, showing currently preferred embodiments of the invention.

DETAILED DESCRIPTION OF PREFERRED EMBODIMENTS

An embodiment of the present invention will now be disclosed with reference to a pulsed radar level gauge. In the context of radar level gauging, a pulsed system determines the distance to the surface of the product contained in the tank based on the difference in time (time-of-flight) between transmission of a pulse and reception of its reflection at the surface of the product. Most pulsed radar level gauge systems employ Time Domain Reflectometry (TDR), which provides a time expansion of the (extremely short) time-of-flight. Such TDR radar level gauge systems generate a transmit pulse train having a first pulse repetition frequency Tx, and a reference pulse train having a second pulse repetition frequency Rx that differs from the transmitted pulse repetition frequency by a known frequency difference $\Delta f$. This frequency difference $\Delta f$ is typically in the range of Hz or tens of Hz.

The transmit pulse train is emitted by a propagating device towards the surface of a product contained in a tank, and the reflected signal is received and sampled with the reference pulse train. In the present disclosure, the propagation device is a transmission line probe, and the gauge is referred to as a "guided wave radar" (GWR) level gauge.

At the beginning of a measurement sweep, the transmission signal and the reference signal are synchronized to have the same phase. Due to the frequency difference, the phase difference between the transmission signal and the reference signal will gradually increase during the measurement sweep. This gradually shifting time sampling of the reflected signal will provide a time expanded version of the time-of-flight of the reflected pulses, from which the distance to the surface of the product contained in the tank can be determined.

Figure 1:
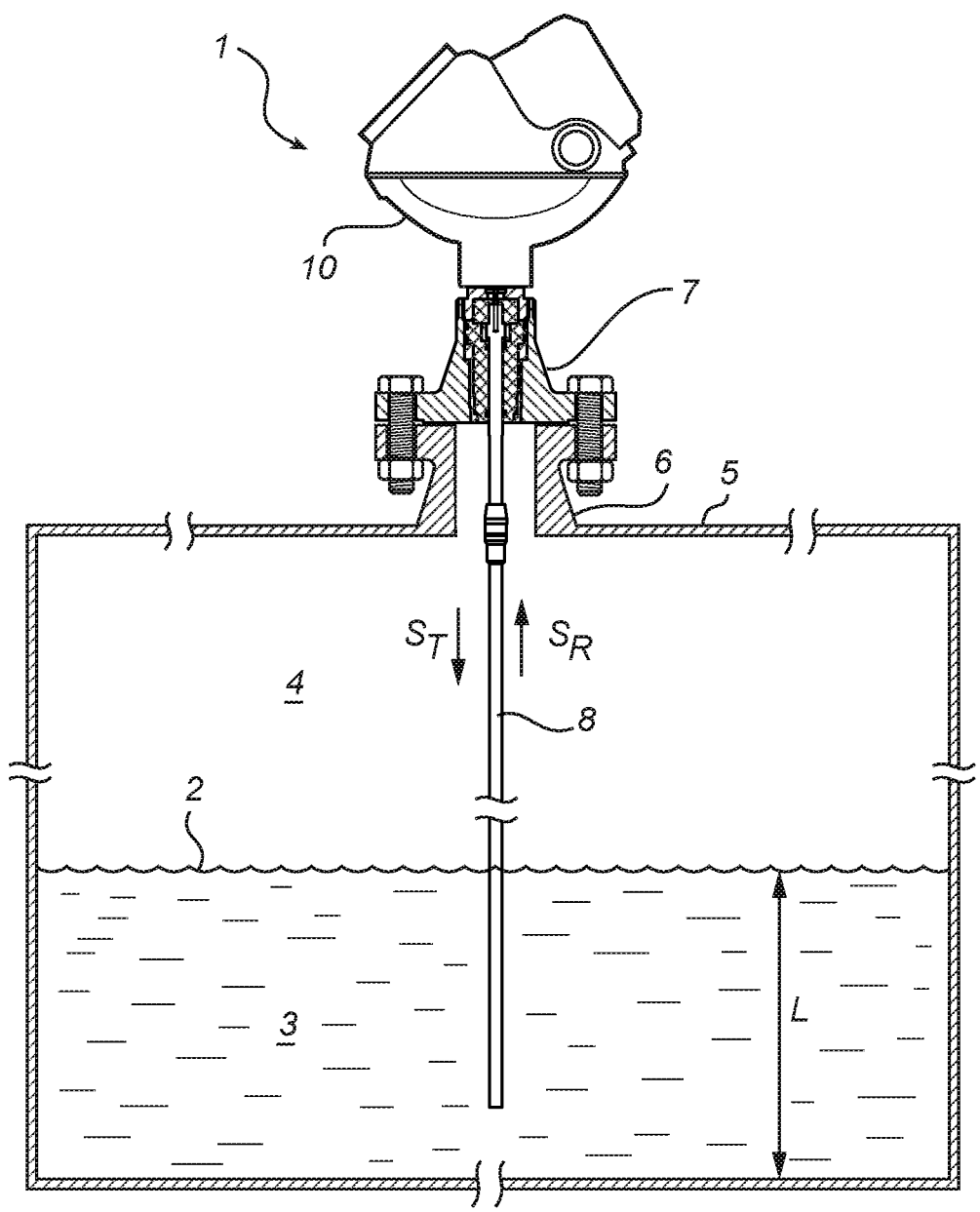
FIG. 1 shows schematically a guided wave radar level gauge.

FIG. 1 shows schematically a guided wave pulsed radar level gauge (RLG) 1 arranged to measure a distance to an interface 2 between two (or more) materials 3, 4 in the tank 5. Typically, the first material 3 is a product stored in the tank, e.g. a liquid such as gasoline, while the second material 4 is air or some other atmosphere. In that case, the RLG will enable detection of the distance to the surface 2 of the content 3 in the tank, and from this determine the filling level L.

The tank 5 is provided with a fastening structure 6 securing the RLG 1 in a measuring position fixed relative the bottom of the tank 5. The RLG 1 includes a feed through structure 7, allowing transmission of signals into and out of the tank. The feed through structure 7 may be arranged to provide process seal, capable of withstanding temperature, pressure, and any chemicals contained in the tank.

The RLG 1 further comprises a transmission line probe 8 arranged to allow propagation of the transmit signal $S_T$ towards the surface 2, and to return a reflected signal $S_R$ resulting from a reflection of the transmit signal at a surface 2 of the product 3. The probe 8 is connected to the transceiver (see FIG. 2) via the feed through structure 7 and extends from the RLG 1 to the bottom of the tank 5. Electromagnetic waves transmitted along the probe 8 will be reflected by any interface 2 between materials in the tank, and the reflection will be transmitted back to the transceiver via the feed through structure 7. The probe can be e.g. a coaxial wire probe, a twin wire probe, or a single wire probe (also referred to as a surface wave guide).

Figure 2:
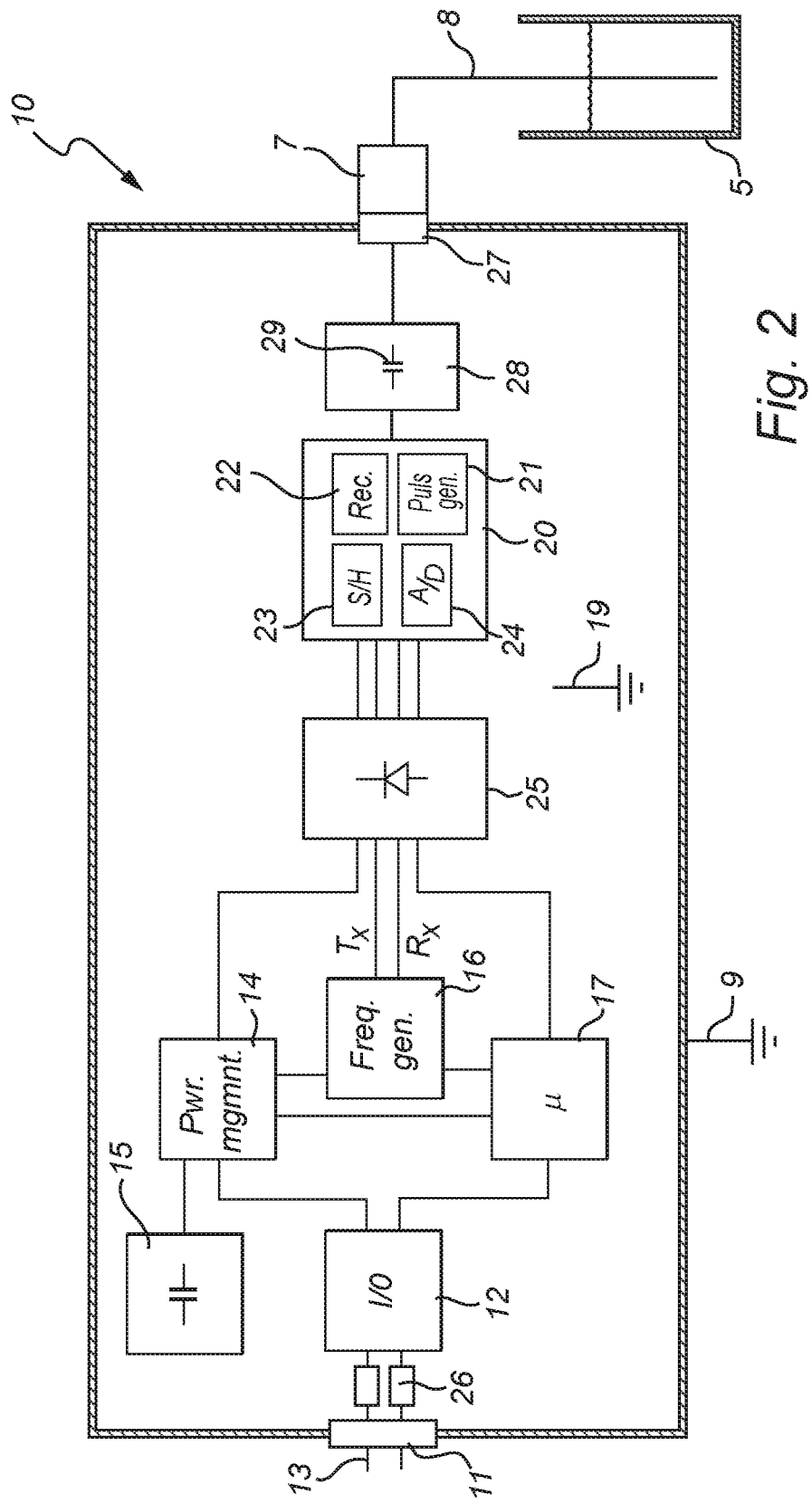
FIG. 2 shows a block diagram of the circuitry and floating IS barrier in the explosion proof housing of the gauge in FIG. 1.

A housing 10 is secured to the feed through structure 7, and houses the electrical components of the RLG 1. The housing 10 is here designed to fulfill the requirements for "explosion proof" enclosure, e.g. as specified in IEC 60079-1. With reference to FIG. 2, the circuitry enclosed in the housing 10 will be described in more detail.

The housing 10 is connected to a housing ground potential 9. A first (explosion proof) signal passage 11 provides external access to a signal/power circuitry 12 which is configured to receive operating power and allow communicating measurement data externally of the RLG 1. In the illustrated example, the signal passage 11 and signal/power circuitry 12 provide a two-wire interface, and may be connected e.g. to a 4-20 mA control loop 13. The current in the loop may correspond to an analogue measurement value (e.g. indicating the filling level L). Alternatively, digital data may be sent across the two-wire loop, using an appropriate protocol such as HART.

The interface 11, 12 is connected to a power management circuitry 14 which is configured to receive and distribute power to the circuitry in the housing 10. The power management circuitry may be connected to an energy store 15, e.g. a capacitance, configured to store energy such that power exceeding the power available from the interface 11, 12, may intermittently be made available. This is particularly useful when using a two-wire control loop with limited current. The power management circuitry 14 may then "scavenge" available power that is not required for immediate operation, and store it in the energy store 15. This stored energy may then be used during a measurement sweep.

The housing 10 further encloses a frequency generator 16 for generating a Tx frequency pulse train and an Rx frequency pulse train. As an example, suitable Tx and Rx frequencies are in the range 0.5-10 MHz, typically 1-2 MHz. Tx is typically greater than Rx, although the opposite relationship is also possible. A critical aspect is the difference between the TX and Rx frequencies, which needs to be several orders of magnitude smaller than the Tx and Rx frequencies. As an example, the difference frequency is in the order of Hz, smaller than 15 Hz, although a larger difference frequency may also be compatible with the technology.

The housing further encloses processing circuitry 17 for determining the distance based on the digital TDR signal. The circuitry 17 is provided with software for analyzing the TDR signal in order to determine a process variable in the tank, typically the level L of the surface 2. The processing circuitry may include a microprocessor (MCU), a FLASH memory for storing program code, a ROM (e.g. an EEPROM) for storing pre-programmed parameters, and a RAM for storing variable parameters.

To the right in FIG. 2 is a high frequency (HF) unit 20, comprising various circuitry for generating, transmitting and receiving microwave signals, and also for sampling the return signal to obtain a time expanded TDR signal. The HF unit 20 is connected to a second (explosion proof) signal passage, serving as an IS output 27 to which the probe 8 is connected via the tank feedthrough 7.

More specifically, the HF unit includes a transceiver circuitry including a pulse generator 21 configured to generate a transmit signal in the form of a pulse train having a pulse repetition frequency equal to the Tx frequency. The pulses may be DC pulses or be modulated by a carrier frequency. The carrier frequency may be in the order of GHz, e.g. 16 GHz or 25 GHz. The duration of the pulses may be in the order of ns, e.g. around 2 ns or less, in order to enable measurement of the relatively short distance between the gauge 1 and the surface 2. The pulses may have average power levels in the order of mW or μW.

The transceiver circuitry also includes a receiver 22, configured to receive the reflected return signal $S_R$, and sampling circuitry 23, configured to sample the return signal $S_R$ with a sampling frequency equal to the Rx frequency in order to provide a time expanded tank signal. The time expanded tank signal, also referred to as a time domain reflectometry (TDR) signal.

The transceiver circuitry further includes a coupling device (not shown) allowing the transceiver to transmit the transmit signal to the probe 8 while simultaneously receiving the reflected signal from the probe 8. The coupling device may be some sort of directional coupler, a circulator, or a solid state switch.

The HF unit 20 here also includes an A/D converter 24 to A/D-convert a TDR signal into the digital TDR signal which is to be processed by the circuitry 17.

The output 27, which is electrically connected to the probe 8 extending into the tank 5, needs to be intrinsically safe. In some applications, the RLG circuitry to the left, including the power management circuitry 14, the frequency generator 16 and the processing circuitry 17, also complies with relevant requirements for intrinsic safety. However, in some applications, the RLG circuitry does not fulfill the IS requirements. For example, as mentioned the RLG circuitry may include an energy store 15, configured to store energy provided by the power management circuitry 14 in order to periodically allow an increased power consumption. If this is the case (as in the illustrated example) an electric barrier 25 is arranged between the RLG circuitry 14, 16, 17 and the HF unit 20, such that all electric signals between the RLG circuitry 14, 16, 17 and HF unit 20 are connected through the barrier 25.

Examples of international standards for intrinsic safety (IS) are IEC 60079-0 and IEC 60079-11, herewith incorporated by reference. These standards utilizes three levels of protection, 'ia', 'ib' and 'ic', which attempt to balance the probability of an explosive atmosphere being present against the probability of an ignition capable situation occurring. The level 'ia' offers the highest level of protection and is generally considered as being adequately safe for use in the most hazardous locations (Zone 0) because the possibility of two 'faults' and a factor of safety of 1.5 is considered in the assessment of safety. The level 'ib', which is adequately safe with one fault and a factor of safety of 1.5 is considered safe for use in less frequently hazardous areas (Zone 1), and the level 'ic' is assessed in 'normal operation' with a unity factor of safety is generally acceptable in infrequently hazardous areas (Zone 2).

The barrier 25 is configured to "clamp" the individual signals with respect to voltage and current, such that the signals provided to the HF unit 20 comply with relevant requirements for intrinsic safety. For example, the barrier may ensure that the signals comply with the Ex-ia requirements mentioned above. The barrier 25 thus essentially serves as a "safety shunt" in accordance with the IEC 60079-11 standard, and the output 27 can then be referred to as an Ex-ia connection, or an "associated Ex-ia output". Here, it is simply referred to as an IS output 27.

The barrier design may be known per se, and may include (for each signal connected though the barrier) fuses to protect from significant power surges, Zener diodes to limit the voltage, and resistors to limit the current. Optionally, the fuses 26 are not necessarily provided in the barrier 25, but may be located immediately inside the first signal passage 11, as shown in FIG. 2.

The Zener diodes are preferable high speed switching, low diode capacitance (Cd) diodes. As an example, the diode capacitance (Cd) may be less than ten pF, and preferably only a few pF. To achieve the desired voltage across the lines, typically a plurality of Zener diodes in series are required, e.g. three or four. To protect also from back-voltage, a second series of one or several Zener diodes should be connected in antiparallel with the first series, to form a complete voltage clamp. In order to comply with regulations, typically three redundant clamps are placed in parallel.

In the illustrated example, there are four signals connected through the barrier 25. Specifically, a power signal from the power management circuitry 14, and the Tx and Rx signals from the frequency generator 16 are connected to the HF unit 20, while the TDR signal is connected from the HF unit 20 to the processing circuitry 17. Additional signals are possible.

In order to reduce the number of signals that pass through the barrier 25, and thus reduce the complexity of the barrier 25, the frequency generator 16 may be moved to the right side of the barrier 25 (the probe side). A potential drawback with this approach is that more electrical power needs to pass the barrier 25, leading to a greater voltage drop across the barrier 25, and thus a higher "lift-off" voltage. A similar trade-off applies to the A/D-converter 24, which here has been indicated on the probe side of the barrier (in the HF unit 20), but also may be placed on the left side.

It is important to note that the barrier 25 is not grounded, i.e. not connected to the housing ground potential 9. The barrier is therefore referred to as a "floating" barrier, in the sense that barrier ground potential 19 is floating with respect to the housing ground potential 9. As a consequence, variation between barrier ground potential 19 and probe potential may cause DC components in the voltage between the HF unit 20 and the probe 8.

For this reason, a DC blocking arrangement 28 is arranged between the HF unit 20 and the signal passage 27. The DC blocking arrangement 28 includes one or several blocking capacitors 29, serving to block any DC components in the signal provided to the probe 8. This DC blocking arrangements will complement the clamping by the barrier 25, by blocking DC and low frequency signals, e.g. originating from the power supply (for example U=250 V, f<60 Hz).

As noted above, in FIGS. 2 and 3 the fuses 26 of the electrical barrier are here located immediately inside the first signal passage 11, i.e. at the connection to the power supply (e.g. two wire bus 13). Such a design may be practical, but it also means that the fuses cannot prevent current generated downstream the fuses from reaching the safety components in the barrier. In particular, capacitances located between the fuses and the safety components may, in the case of an error, store energy and generate large currents, which may damage the safety components in the barrier. When the fuses are placed as in FIGS. 2 and 3, it may therefore be necessary to clamp capacitances arranged between the fuses and the safety components, e.g. using additional Zener diodes.

Alternatively, the fuses 26 may be provided immediately before the safety components in the barrier 25. In this case, one fuse for each signal is required, so four fuses in the illustrated example. In this case, the additional clamping of upstream capacitances is not required. However, the fuses in FIG. 4 cannot prevent current through the (floating) barrier ground 19. Consequently, an additional set of blocking capacitors may be provided between the barrier 25 and the housing ground potential 9.

Figure 3:
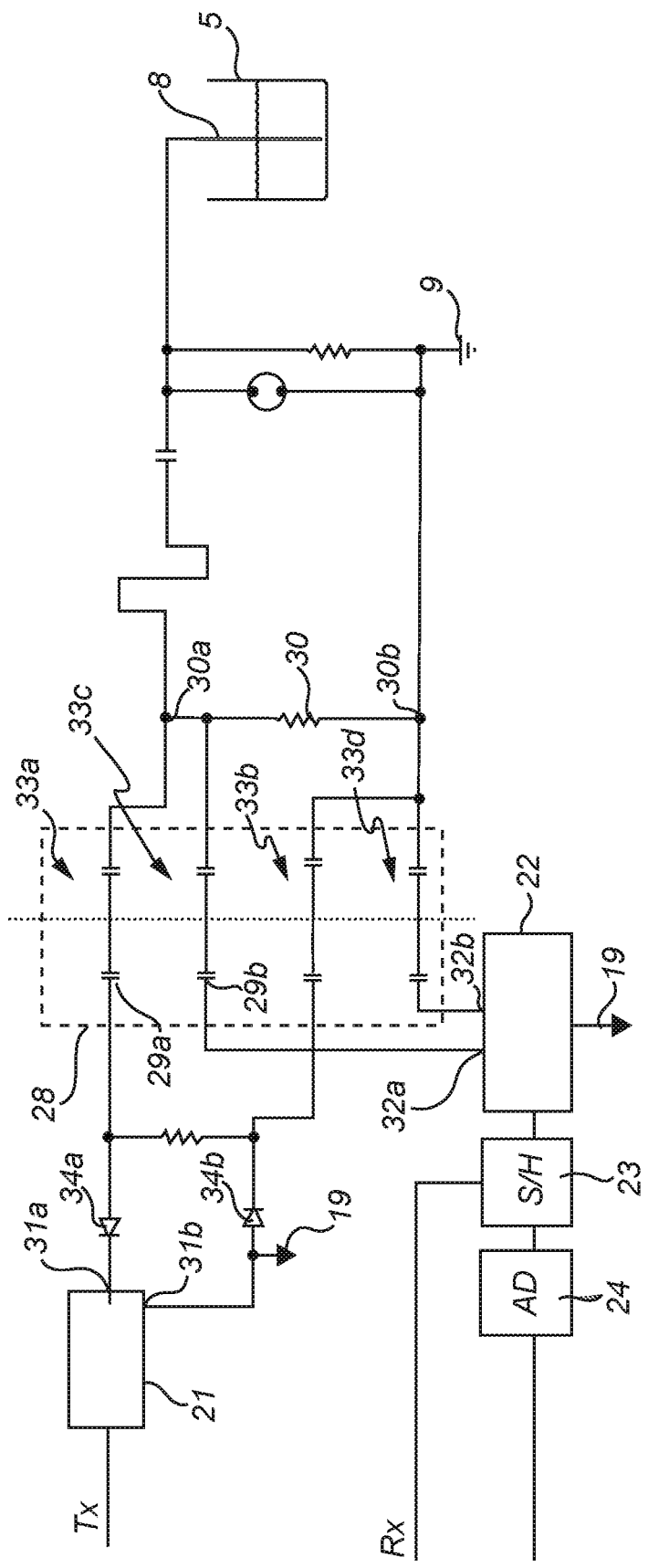
FIG. 3 shows a schematic circuit diagram of the microwave unit in FIG. 2, according to an embodiment of the invention.

The circuitry in the microwave unit 20 is shown in more detail in FIG. 3.

The pulse generator 21 has two output terminals 31a, 31b. The first terminal 31a is electrically connected to the IS output 27 via the set of blocking capacitors 28, while the second terminal 31b is connected to the housing ground potential 9 via the set of blocking capacitors 28. The pulse generator 21 is also connected to the floating barrier ground potential 19.

According to the present invention, the receiver is a differential receiver 22, having two input terminals 32a, 32b. The first terminal 32a is electrically connected to the IS output 27 via the set of blocking capacitors 28, while the second terminal 32b is connected to the housing ground potential 9 via the set of blocking capacitors 28. The voltage between the two terminals forms the input signal to the receiver 22. The receiver 22 is also connected to the floating barrier ground potential 19.

As discussed above, the set of blocking capacitors 28 forms a boundary between barrier ground potential 19 and housing ground potential 9. In the illustrated embodiment, the set of blocking capacitors 28 comprises four pairs 33a, 33b, 33c, 33d of capacitors. Specifically, a first pair of blocking capacitors 33a is connected in series between the first terminal 31a of the pulse generator and the first terminal 30a of the resistor 30 (connected to the IS output 27), a second pair of blocking capacitors 33b is connected in series between the second terminal 31b of the pulse generator and the second terminal 30b of the resistor 30 (connected to the housing ground potential 9), a third pair of blocking capacitors 33c is connected in series between the first terminal 32a of the differential receiver and the first terminal 30a of the resistor 30, and a fourth pair of blocking capacitors 33d is connected in series between the second terminal 32b of the differential receiver and the second terminal 30b of the resistor 30.

As the capacitors are connected on the RLG side of the resistor 30, they can thus be arranged on four different lines instead of only two. Also, the coupling capacitors will meet a greater impedance.

The required capacitance of each pair of blocking capacitors will depend on the input impedance of the respective terminal. As an example, the pulse generator 21 may have an input impedance of around 500 Ohm (including diodes 34a and 34b), and an appropriate capacitance "facing" the pulse generator may be around 100 pF (i.e. two 200 pF blocking capacitors 29a in series). As will be discussed in the following, the differential receiver 22 may have an even higher input impedance, and an appropriate capacitance "facing" the pulse generator may be around 20 pF (i.e. two 40 pF blocking capacitors 29b in series).

Figure 4:
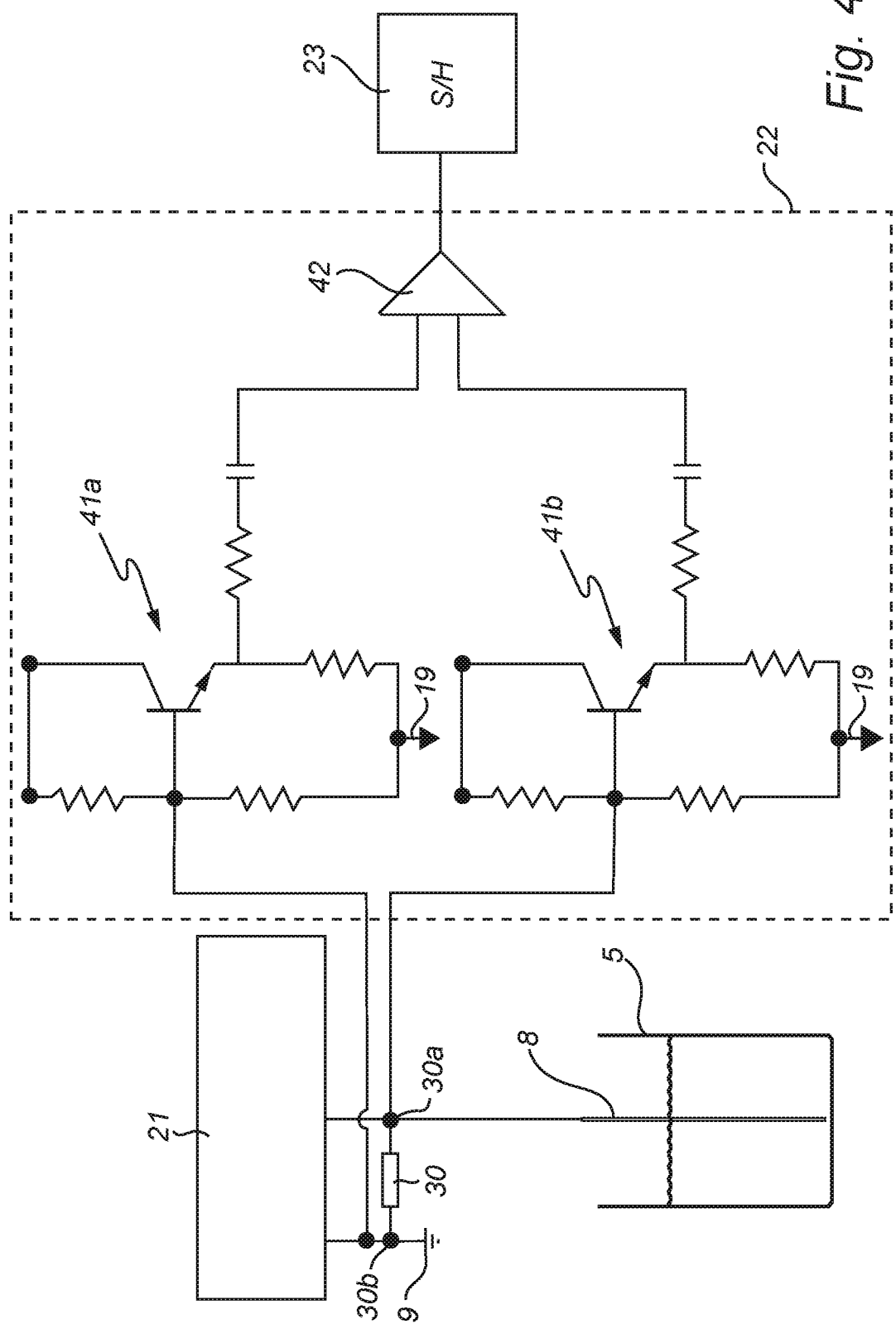
FIG. 4 shows connection of impedance increasing circuitry according to an embodiment of the invention.

As mentioned above, it is, for several reasons, desirable to increase the input impedance of the differential receiver. For this purpose, as shown in FIG. 4, a first impedance increasing circuit 41a may be connected between the first terminal 32a of the differential receiver 22 and the third pair of blocking capacitors 33c, and a second impedance increasing circuit 41b may be connected between the second terminal 32b of the differential receiver 22 and the fourth pair of blocking capacitors 33d. The impedance increasing circuits in FIG. 4 are so called emitter-followers, known in the art. Other circuits may also be used, such as Darlington, MOS, etc.

The person skilled in the art realizes that the present invention by no means is limited to the preferred embodiments described above. On the contrary, many modifications and variations are possible within the scope of the appended claims. For example, additional or different safety components may be included in the barrier than those discussed above.

What is claimed is:

1. A guided wave radar level gauge for determining the filling level of product in a tank, said gauge comprising:
   a housing providing explosion proof protection, and being electrically connected to a housing ground potential,
   an explosion proof first signal passage in said housing wall, said first signal passage configured to be connected to an external power supply,
   an explosion proof second signal passage in said housing wall, said second signal passage providing an intrinsically safe, IS, output,
   a resistor having a first terminal connected to the IS output and a second terminal connected to the housing ground potential,
   a transmission line probe connected to said IS output, said probe being adapted to direct a microwave transmit signal toward said product and return reflections thereof from a surface of said product,
   wherein said housing encloses:
      radar level gauge, RLG, circuitry,
      a microwave unit connected to the IS output, said microwave unit configured to generate and transmit an microwave transmit signal $S_T$ and receive a microwave return signal $S_R$ reflected from the tank,
      said RLG circuitry and said microwave unit having a floating ground potential which is independent from said housing ground potential, and
      a set of blocking capacitors connected between the microwave unit and the IS output, which blocking capacitors serve to block any DC components,
   wherein the microwave unit includes:
      a pulse generator having a first terminal connected to said IS output via said set of blocking capacitors, and a second terminal connected to said housing ground potential via said set of blocking capacitors, and
      a differential receiver, having a first terminal connected to said IS output via said set of blocking capacitors, and a second terminal connected to said housing ground potential via said set of blocking capacitors, a voltage between said first and second terminals forming an input signal to said differential receiver.

2. The radar level gauge according to claim 1, wherein said set of blocking capacitors includes:
   a first pair of blocking capacitors connected in series between the first terminal of the pulse generator and the first terminal of the resistor,
   a second pair of blocking capacitors connected in series between the second terminal of the pulse generator and the second terminal of the resistor,
   a third pair of blocking capacitors connected in series between the first terminal of the differential receiver and the first terminal of the resistor, and
   a fourth pair of blocking capacitors connected in series between the second terminal of the differential receiver and the second terminal of the resistor.

3. The radar level gauge according to claim 1, wherein the differential receiver includes:

a first impedance increasing circuit connected to increase an input impedance of the first terminal, and a second impedance increasing circuit connected to increase an input impedance of the second terminal.

4. The radar level gauge according to claim 3, wherein each impedance increasing circuitry includes an emitter follower.

5. The radar level gauge according claim 1, wherein said RLG circuitry is incompatible with intrinsic safety requirements, and further comprising an electrical barrier connected between the RLG circuitry and the microwave unit, said electrical barrier preventing energy or voltages incompatible with IS requirements from reaching said microwave unit.

6. The radar level gauge according to claim 5, wherein said RLG circuitry includes at least one energy store having an energy storage capacity which is incompatible with IS requirements at a voltage applied to the energy store.

7. The radar level gauge according to claim 5, wherein the electrical barrier, for each signal connected through the barrier, includes at least one Zener diode connected between the signal and barrier ground, to limit the voltage to a desired range.

8. The radar level gauge according to any one of claim 5, wherein the electrical barrier, for each signal connected through the barrier, includes a serially connected fuse to protect from significant power surges and a serially connected resistor to limit the current to a desired range.

9. The radar level gauge according to claim 1, wherein said RLG circuitry includes:

processing circuitry configured to determine the distance between a reference position and the surface of the product based on a relationship between the transmit signal and the return signal, and signal/power circuitry configured to receive operating power and communicate measurement data.

10. The radar level gauge according to claim 9, wherein said pulse generator generates and transmits an electromagnetic transmit signal $S_T$, and wherein said differential receiver receives an electromagnetic return signal $S_R$ reflected from the tank.

11. The radar level gauge according to claim 10, wherein the transmit signal is a train of pulses, each pulse having a duration in the order of ns, and a pulse repetition frequency in the order of MHz.

12. The radar level gauge according to claim 11, wherein the RLG circuitry includes a frequency generator, configured to generate a first repetition frequency Tx, defining the pulse repetition frequency of the pulse generator, and a second repetition frequency Rx, for performing time domain reflectometry sampling of the return signal $S_R$.

13. The radar level gauge according to claim 1, further comprising an additional set of blocking capacitors connected between the floating ground potential and the housing ground potential.

14. The radar level gauge according to claim 1, wherein said intrinsically safe output is adapted to ensure that high frequency energy transmitted through the first signal passage complies with requirements defined in clause 6.6.1 of IEC 60079-0, or wherein said intrinsically safe output complies with the Ex-ia requirements of IEC 60079-11.

15. The radar level gauge according to claim 1, wherein said compartment and said first and second signal passages comply with Ex-d requirements of IEC 60079-1.

* * * * *